United States Patent
Ikeda

(10) Patent No.: US 6,689,690 B2
(45) Date of Patent: Feb. 10, 2004

(54) SEMICONDUCTOR DEVICE MANUFACTURING METHOD OF FORMING AN ETCHING STOPPER FILM ON A DIFFUSION PREVENTION FILM AT A HIGHER TEMPERATURE

(75) Inventor: Masanobu Ikeda, Kawasaki (JP)

(73) Assignee: Fujitsu Limited, Kawasaki (JP)

(*) Notice: Subject to any disclaimer, the term of this patent is extended or adjusted under 35 U.S.C. 154(b) by 26 days.

(21) Appl. No.: 10/055,880

(22) Filed: Jan. 28, 2002

(65) Prior Publication Data

US 2003/0017698 A1 Jan. 23, 2003

(30) Foreign Application Priority Data

Jul. 4, 2001 (JP) .......................................... 2001-203723

(51) Int. Cl.[7] .............................................. H01L 21/44
(52) U.S. Cl. ....................... 438/687; 438/791; 438/761; 438/788; 438/790
(58) Field of Search ................................. 438/687, 758, 438/761, 763, 786, 788, 789, 790, 791, 792, 793, 795, 902

(56) References Cited

U.S. PATENT DOCUMENTS

| | | | | |
|---|---|---|---|---|
| 5,700,737 A | * | 12/1997 | Yu et al. ...................... | 438/636 |
| 5,882,996 A | * | 3/1999 | Dai .............................. | 438/597 |
| 5,893,752 A | * | 4/1999 | Zhang et al. ................ | 438/687 |
| 6,007,624 A | * | 12/1999 | Wise ............................ | 117/96 |
| 6,016,011 A | * | 1/2000 | Cao et al. ..................... | 257/773 |
| 6,071,809 A | * | 6/2000 | Zhao ........................... | 438/634 |
| 6,096,659 A | * | 8/2000 | Gardner et al. ............. | 438/736 |
| 6,121,145 A | * | 9/2000 | Huang ......................... | 438/692 |
| 6,171,949 B1 | * | 1/2001 | You et al. ................... | 438/633 |
| 6,174,810 B1 | * | 1/2001 | Islam et al. ................. | 438/687 |
| 6,222,269 B1 | * | 4/2001 | Usami ......................... | 257/758 |
| 6,248,665 B1 | * | 6/2001 | Bao et al. .................... | 438/687 |
| 2002/0024139 A1 | * | 2/2002 | Chan et al. ................. | 257/758 |

FOREIGN PATENT DOCUMENTS

JP      2000-183059      6/2000

* cited by examiner

*Primary Examiner*—Matthew Smith
*Assistant Examiner*—Renzo N Rocchegiani
(74) *Attorney, Agent, or Firm*—Westerman, Hattori, Daniels & Adrian, LLP

(57) ABSTRACT

A method of manufacturing a semiconductor device is provided. The method including the steps of forming an insulating interlayer film on a substrate, forming a Cu interconnection pattern in the insulating interlayer film, forming a first insulating film on the insulating interlayer film at a first temperature lower than 400° C. in a nonoxide situation so that the first insulating film covers the Cu interconnection pattern, and forming a second insulating film on the first insulating film at a second temperature higher than the first temperature.

13 Claims, 12 Drawing Sheets

SEMICONDUCTOR DEVICE
MANUFACTURING METHOD OF FORMING
AN ETCHING STOPPER FILM ON A
DIFFUSION PREVENTION FILM AT A
HIGHER TEMPERATURE

CROSS REFERENCE TO RELATED
APPLICATIONS

This application is based upon and claims priority of Japanese Patent Applications No. 2001-203723, filed in Jul. 4, 2001, the contents being incorporated herein by reference.

BACKGROUND OF THE INVENTION

1. Field of the Invention

The present invention generally relates to a semiconductor device and, more particularly, to a semiconductor device having a multilayer interconnection structure, and a manufacturing method thereof.

As semiconductor integrated circuit devices have been becoming smaller in size, a multitude of semiconductor elements have come to be formed on a semiconductor substrate. A single interconnection layer is not sufficient to connect these numerous semiconductor elements. Accordingly, a multilayer interconnection structure laminated in a plurality of interconnection layers is used instead of such a single interconnection layer. A typical multilayer interconnection structure comprises a lamination of a multitude of interconnection layers each formed between insulating interlayer films. In this structure, the interconnection layers are connected by via holes formed in the insulating interlayer films.

Additionally, this multilayer interconnection structure has considerably complicated interconnection patterns corresponding to a multitude of semiconductor elements formed on a substrate. Accordingly, these interconnection patterns have a very large total length. As a result, the delay of an electric signal being transmitted through the interconnection patterns has become too large to ignore, and due to this signal delay, signal waveforms have been broken to a degree that cannot be disregarded. Thereupon, in order to minimize the signal delay in the multilayer interconnection structure, conventional technologies have attempted to use a low dielectric constant material as the insulating interlayer film. Also, in order to minimize an interconnect resistance, conventional technologies have attempted to use a low resistance material, especially Cu, as an interconnect material.

When Cu is used as the interconnect material, a damascene method has been employed, because an effective dry etching method has not been available yet. In the damascene method, grooves corresponding to interconnection patterns and via holes are formed beforehand in an insulating interlayer film; then, the grooves are filled with a Cu layer; and thereafter, part of the Cu layers existing on the surface of the insulating interlayer film is removed by a CMP (Chemical Mechanical Polishing) method.

2. Description of the Related Art

FIG. 1A to FIG. 3B show a first conventional example of steps of forming a multilayer interconnection structure according to a dual damascene method.

In a step shown in FIG. 1A, an underlying interconnection pattern 10, such as Cu, is formed on an Si substrate 1 with an insulating film (not shown in FIG. 1A to FIG. 3B) therebetween. A first etching stopper film 12 of SiN is formed on the underlying interconnection pattern 10 by a plasma CVD method. A first insulating interlayer film 14 of $SiO_2$ is formed on the SiN film 12 by the plasma CVD method. A second etching stopper film 16 of SiN is formed on the $SiO_2$ film 14 by the plasma CVD method. Further, a resist pattern 18 is formed on the SiN film 16. A resist opening 18A is formed in the resist pattern 18 at a position corresponding to a contact hole (28) to be formed in the multilayer interconnection structure.

Next, in a step shown in FIG. 1B, the SiN film 16 is subjected to a dry etching using the resist pattern 18 as a mask so as to form an opening 20 in the SiN film 16. The opening 20 is formed at a position corresponding to the resist opening 18A. After the opening 20 is formed, the resist pattern 18 is removed by ashing.

Next, in a step shown in FIG. 1C, an $SiO_2$ film 22 is so formed, as a second insulating interlayer film, on the SiN film 16 by a CVD method as to cover the opening 20.

Subsequently, in a step shown in FIG. 2A, a resist pattern 24 having an opening 24A is formed on the $SiO_2$ film 22. The opening 24A is at a position corresponding to an interconnection groove (26) to be formed in the $SiO_2$ film 22 so as to include the opening 20 formed in the SiN film 16. In a step shown in FIG. 2B, the $SiO_2$ film 22 is subjected to a dry etching using the resist pattern 24 as a mask so as to form an interconnection groove 26 in the $SiO_2$ film 22. At this point, the SiN film 16 and the opening 20 are exposed at the bottom of the interconnection groove 26. The above-mentioned dry etching is continuously performed to the $Sio_2$ film 14 exposed in the opening 20 by using the SiN film 16 as a mask so as to form a contact hole 28 in the $SiO_2$ film 14. The SiN film 12 is exposed at the bottom of the contact hole 28.

Subsequently, in a step shown in FIG. 2C, the SiN film 12 exposed at the bottom of the contact hole 28 is removed by etching so that the Cu interconnection pattern 10 is exposed at the bottom of the contact hole 28. In a step shown in FIG. 3A, the interconnection groove 26 and the contact hole 28 are filled by sputtering Cu and electroplated Cu. Further, in a step shown in FIG. 3B, a part of the Cu layer 29 above the surface of the second insulating interlayer film 22 is removed by a CMP method so as to leave a Cu pattern 29A in the interconnection groove 26 and the contact hole 28 of the multilayer interconnection structure shown in FIG. 3B.

In the above-described steps of forming the multilayer interconnection structure according to the dual damascene method, the interconnection groove 26 and the contact hole 28 are continuously formed by one dry etching process. This simplifies manufacturing steps of a semiconductor device.

FIG. 4A to FIG. 5C show a second conventional example of steps of forming a multilayer interconnection structure. Elements in FIG. 4A to FIG. 5C that are described above are referenced by the same reference marks, and will not be described in detail.

In a step shown in FIG. 4A, an SiN film 30 is formed, as a first etching stopper film, on the Cu interconnection pattern 10 by a plasma CVD method. In this second example, an organic SOG film 32 is applied, as a first insulating interlayer film, on the SiN film 30 by such a method as a spin coating. An SiN film 34 is formed, as a second etching stopper film, on the organic SOG film 32 by the plasma CVD method. Further, an organic SOG film 36 is formed, as a second insulating interlayer film, on the SiN film 34 by the plasma CVD method.

Further, a resist pattern 38 having an opening 38A is formed on the organic SOG film 36. The opening 38A is at a position corresponding to a contact hole (40) to be formed in the organic SOG film 32.

Next, in a step shown in FIG. 4B, the organic SOG film 36, the SiN film 34 and the organic SOG film 32 are etched by using the resist patter 38 as a mask so as to form a contact hole 40.

Subsequently, in a step shown in FIG. 4C, a resist pattern 42 having an opening 42A is formed on the organic SOG film 36. The opening 42A is at a position corresponding to an interconnection groove (44) to be formed in the organic SOG film 36 so as to include the contact hole 40.

Subsequently, in a step shown in FIG. 5A, the organic SOG film 36 is etched by using the resist pattern 42 as a mask so as to form an interconnection groove 44 in the organic SOG film 36. During this interconnection groove 44 being formed, the resist pattern 42 is removed by the organic SOG film 36 etching. As described above, the interconnection groove 44 includes the contact hole 40. The interconnection groove 44 exposes the SiN film 34 at the bottom part thereof. The contact hole 40 exposes the SiN film 30 at the bottom thereof.

After the etching process in the step shown in FIG. 5A, a step shown in FIG. 5B is performed, in which the SiN film 34 exposed at the bottom part of the interconnection groove 44 and the SiN film 30 exposed at the bottom of the contact hole 40 are etched such that the underlying Cu interconnection pattern 10 is exposed at the bottom of the contact hole 40. In a step shown in FIG. 5C, the interconnection groove 44 and the contact hole 40 are filled with the Cu layer 29, as in the step shown in FIG. 3A. Further, in the step shown in FIG. 5C, a part of the Cu layer 29 above the surface of the second insulating interlayer film 36 is removed by a CMP method, as in the step shown in FIG. 3B, so as to leave the Cu pattern 29A in the interconnection groove 44 and the contact hole 40 of the multilayer interconnection structure.

As described above, in a dual damascene process according to the second conventional example, the contact hole 40 and the interconnection groove 44 are formed by two separate etching processes. This facilitates an alignment of a mask in a resist patterning for the interconnection groove.

The organic insulating interlayer films 32 and 36 used in the above-described steps shown in FIG. 4A to FIG. 5C can be applied to the steps of forming the insulating interlayer films shown in FIG. 1A to FIG. 3B. Conversely, the inorganic insulating interlayer films 14 and 22 used in the above-described steps shown in FIG. 1A to FIG. 3B can be applied to the steps of forming the insulating interlayer films shown in FIG. 4A to FIG. 5C.

The actual multilayer interconnection structure includes a plurality of the structures each shown in FIG. 3B or FIG. 5C by repeating the steps shown in FIG. 1A to FIG. 3B or the steps shown in FIG. 4A to FIG. 5C.

As described above, the etching stopper films 12 and 16 or the etching stopper films 30 and 34 play an important role in forming a multilayer interconnection structure according to a dual damascene method. Conventionally, SiN films have been used as these etching stopper films, because the SiN films can secure a large etching selectivity in contrast to the insulating interlayer films.

By the way, in order that the SiN films function as effective etching stopper films, the SiN films need to have a large film density. Therefore, in general, the SiN films are formed by a plasma CVD method at a high temperature not lower than 400° C. However, when the SiN films are formed at such a high temperature, a thermal expansion occurs in a Cu interconnection pattern already formed in an interconnection structure; thereafter, when the temperature is returned to a room temperature, a large residual stress occurs in the Cu interconnection pattern. The SiN film formed on the Cu interconnection pattern functions not only as an etching stopper film, but also as a diffusion prevention film preventing the diffusion of Cu.

In the interconnection structure including the Cu interconnection pattern subjected to the residual stress, especially when the interconnection structure is left in a high-temperature environment, a stress-migration tends to occur in the Cu interconnection pattern, causing a reliability problem such as a disconnection of the Cu interconnection pattern. Further, when the SiN films are formed at a high temperature, a Cu protuberance tends to occur in an interface between the Cu interconnection pattern and the SiN film. The problem of the above-mentioned stress-migration in the Cu interconnection pattern has been becoming serious in a recent micronized semiconductor device.

FIG. 6 shows an example of a semiconductor device in which a stress-migration occurs in a Cu interconnection pattern.

As shown in FIG. 6, an n-type well 51A and a p-type well 51B are formed according to element areas isolated by an isolation area 52 on an Si substrate 51. In the element area comprising the n-type well 51A, a gate electrode 53A is formed on the surface of the Si substrate 51 with a gate oxide film therebetween. Similarly, in the element area comprising the p-type well 51B, a gate electrode 53B is formed on the surface of the Si substrate 51 with a gate oxide film therebetween. In the n-type well 51A, p-type diffusion areas 51a and 51b are formed at both sides of the gate electrode 53A. Similarly, in the p-type well 51B, n-type diffusion areas 51c and 51d are formed at both sides of the gate electrode 53B.

An insulating interlayer film 54 is so formed on the Si substrate 51 as to cover the gate electrodes 53A and 53B. Via holes 54a to 54d are formed in the insulating interlayer film 54 by using an SiN film 55 formed thereon as a mask so as to expose the diffusion areas 51a to 51d on the bottom. W-plugs 54A to 54D are formed in the via holes 54a to 54d.

An interconnection layer 56 is formed on the SiN film 55. The interconnection layer 56 includes Cu interconnection patterns 56A to 56D contacting the W-plugs 54A to 54D, respectively. An insulating interlayer film 58 is formed on the interconnection layer 56 with an etching stopper film 57 therebetween. The etching stopper film 57 is formed by an SiN film.

Via holes 59A to 59C are formed in the insulating interlayer film 58 by using an SiN film 59 formed thereon as a mask. The via holes 59A to 59C are formed at positions corresponding to the Cu interconnection patterns 56A to 56C, respectively. In a state shown in FIG. 6, the via holes 59A to 59C reach the SiN etching stopper film 57.

In the semiconductor device shown in FIG. 6, when the SiN film 57 is formed at a normal processing temperature of approximately 400° C., stress-migrations occur in the Cu interconnection patterns 56A to 56D in the interconnection layer 56 due to a residual stress, or Cu protuberances occur in interfaces between the Cu interconnection patterns 56A to 56D and the SiN film 57, as described above. As a result, the SiN etching stopper film 57 may possibly be damaged, as seen in the via hole 59B shown in FIG. 6. When the etching stopper film 57 is damaged as in the via hole 59B, the Cu interconnection pattern 56B thereunder is exposed so as to cause a problem such as a disconnection in the Cu interconnection pattern 56B. Such defects in the Cu interconnection patterns due to stress-migrations and Cu protuberances are likely to occur when the semiconductor device is left in a high-temperature environment.

In order to relax the residual stress occurring in the Cu interconnection patterns, the SiN film may be formed at a lower temperature. However, an SiN film formed at such a low temperature has a low film density, and thus does not function as an effective etching stopper film in forming a contact hole and an interconnection groove. As a result, using such an SiN film formed at a low temperature as the etching stopper film 57 decreases an initial yield in manufacturing a semiconductor device.

By the way, conventionally, as seen in Japanese Laid-Open Patent Application No. 2000-183059, there has been a publicly known structure for increasing an adhesion between the Cu interconnection pattern and the SiN etching stopper film, in which an Si-rich SiN film is used as an etching stopper film at a part contacting a Cu interconnection pattern, and an N-rich SiN film is formed on the Si-rich SiN film. According to this publicly known method, these SiN films can be formed at a temperature not higher than 400° C. Therefore, it is conceivable that this method can possibly solve the above-mentioned problem of the stress-migration in the Cu interconnection pattern.

However, when an experiment is actually carried out in which the Si-rich SiN film is so formed as to contact the Cu interconnection pattern, there occurs a problem that $SiH_4$ abundantly supplied as a substance for the Si-rich SiN film reacts with the Cu interconnection pattern so that a high-resistive Cu-silicide ($CuSi_2$) is formed on the surface of the Cu interconnection pattern. Accordingly, it is confirmed that the above-mentioned conventional method cannot solve the problem of the stress-migration in a multilayer interconnection structure including a Cu interconnection pattern.

SUMMARY OF THE INVENTION

It is a general object of the present invention to provide an improved and useful semiconductor device and a manufacturing method thereof in which the above-mentioned problems are eliminated.

A more specific object of the present invention is to alleviate a stress-migration occurring in a Cu interconnection pattern included in a multilayer interconnection structure of a semiconductor device.

In order to achieve the above-mentioned objects, there is provided according to one aspect of the present invention a method of manufacturing a semiconductor device, the method comprising the steps of:

forming an insulating interlayer film on a substrate;

forming a Cu interconnection pattern in the insulating interlayer film;

forming a first insulating film on the insulating interlayer film at a first temperature lower than 400° C. in a nonoxide situation so that the first insulating film covers the Cu interconnection pattern; and forming a second insulating film on the first insulating film at a second temperature higher than the first temperature.

Additionally, the semiconductor device manufacturing method according to the present invention may preferably further comprise the temperature-decreasing step of decrease a substrate temperature from the first temperature to a room temperature, and the temperature-increasing step of increase the substrate temperature from the room temperature to the second temperature, after the step of forming the first insulating film and before the step of forming the second insulating film.

Additionally, in the semiconductor device manufacturing method according to the present invention, the step of forming the first insulating film, the temperature-decreasing step, the temperature-increasing step and the step of forming the second insulating film may preferably be performed in succession in a same depositing device.

Additionally, in the semiconductor device manufacturing method according to the present invention, when the first insulating film and the second insulating film are SiN films, the step of forming the first insulating film may preferably be performed by setting the first temperature within a range from 300 to 350° C., and the step of forming the second insulating film may preferably be performed by setting the second temperature within a range from 350 to 400° C. Additionally, the step of forming the first insulating film and the step of forming the second insulating film may preferably be performed by a plasma CVD method in a mixed gas plasma of a silane gas, an ammonia gas and a nitrogen gas.

Additionally, in the semiconductor device manufacturing method according to the present invention, when the first insulating film and the second insulating film are SiN films, the step of forming the first insulating film may preferably be performed by setting the first temperature within a range from 300 to 350° C., and the step of forming the second insulating film may preferably be performed by setting the second temperature within a range from 350 to 400° C. Additionally, the step of forming the first insulating film and the step of forming the second insulating film may preferably be performed by a plasma CVD method in a mixed gas plasma of a methylsilane gas, an ammonia gas and a nitrogen gas.

In order to achieve the above-mentioned objects, there is also provided according to another aspect of the present invention a semiconductor device comprising:

a substrate;

a first insulating interlayer film formed on the substrate;

a Cu interconnection pattern formed in the first insulating interlayer film;

a first insulating film formed on the first insulating interlayer film so as to cover the Cu interconnection pattern and contact the Cu interconnection pattern, the first insulating film being composed of a nonoxide;

a second insulating film formed on the first insulating film; and a second insulating interlayer film formed on the second insulating film, wherein the second insulating film exhibits a lower etching rate when an etching process is performed to the second insulating interlayer film than an etching rate of the first insulating film when the etching process is performed to the first insulating film.

In order to achieve the above-mentioned objects, there is also provided according to another aspect of the present invention a semiconductor device comprising:

a substrate;

an insulating interlayer film formed on the substrate;

a Cu interconnection pattern formed in the insulating interlayer film;

a first insulating film formed on the insulating interlayer film so as to cover the Cu interconnection pattern and contact the Cu interconnection pattern, the first insulating film being composed of a nonoxide; and a second insulating film formed on the first insulating film, wherein the second insulating film has a higher film density than the first insulating film.

Additionally, in the semiconductor device according to the present invention, the first insulating film and the second insulating film may preferably be formed of SiN films or SiC films. When the first insulating film and the second insulating film are formed of SiN films, the first insulating film may preferably be so formed as to have a film density lower than 2.8 g/cm$^3$, and the second insulating film may preferably be so formed as to have a film density equal to or higher than 2.8 g/cm$^3$. When the first insulating film and the second insulating film are formed of SiC films, the first insulating film may preferably be so formed as to have a film density lower than 1.9 g/cm$^3$, and the second insulating film may preferably be so formed as to have a film density equal to or higher than 1.9 g/cm$^3$.

According to the present invention, the first insulating film directly covering the Cu interconnection pattern is formed at a low temperature so as to avoid a problem of a residual stress occurring in the Cu interconnection pattern and a stress-migration resulting therefrom. On the other hand, when the first insulating film is formed at such a low temperature as to prevent a stress-migration, the first insulating film may possibly come to have too low a film density to function sufficiently as an etching stopper film. To avoid this risk, the second insulating film having a high film density is formed on the first insulating film at a higher temperature. When the second insulating film is formed at such a high temperature, the Cu interconnection pattern undergoes a high-temperature treatment. However, the first insulating film already formed on the surface of the Cu interconnection pattern can restrain the above-mentioned stress-migration.

Other objects, features and advantages of the present invention will become more apparent from the following detailed description when read in conjunction with the accompanying drawings.

DETAILED DESCRIPTION OF THE PREFERRED EMBODIMENTS

A description will now be given, with reference to the drawings, of embodiments according to the present invention.

[Embodiment 1]

Figure 7:
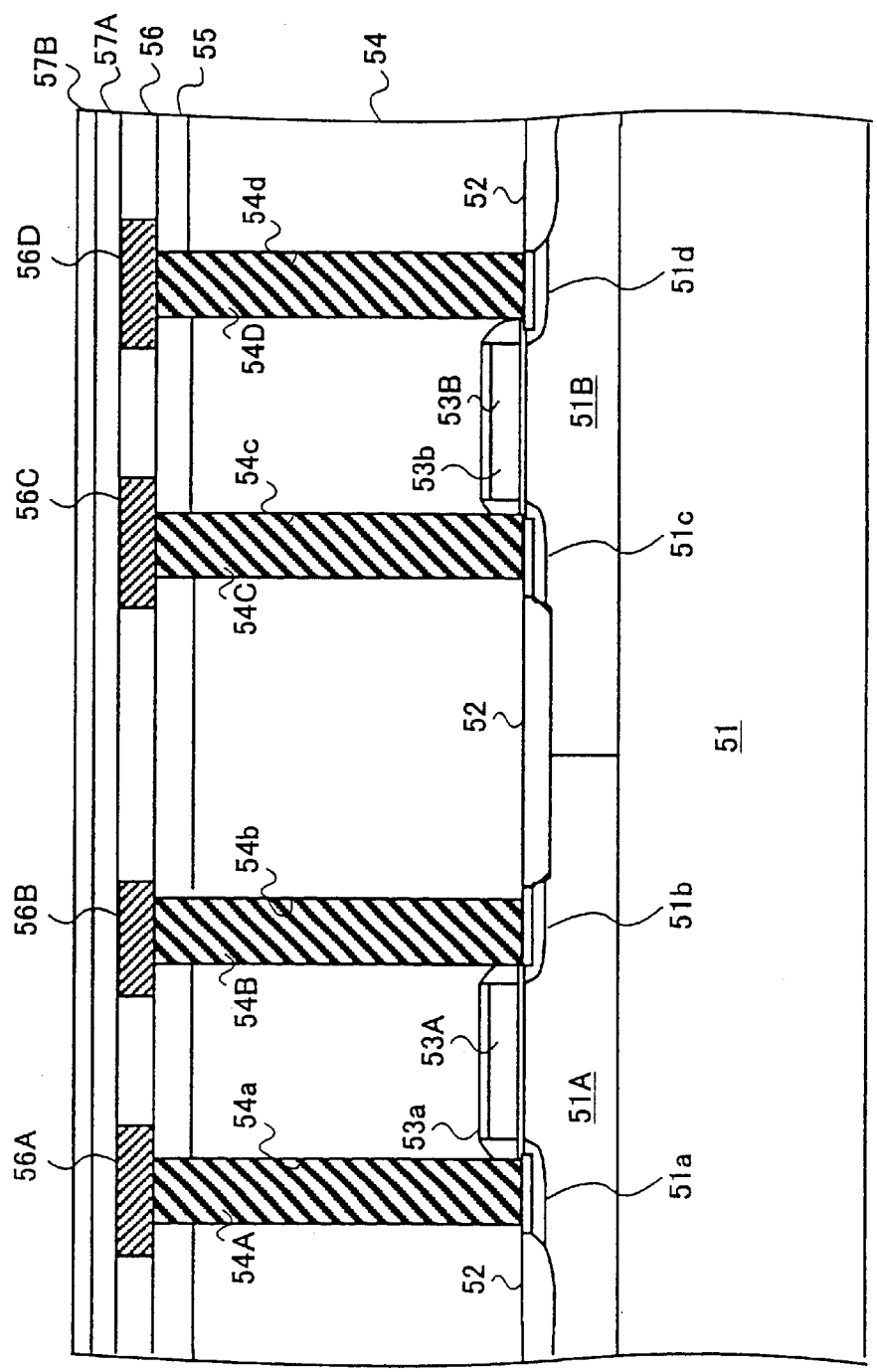
FIG. 7 is an illustration of a structure of a semiconductor device according to a first embodiment of the present invention.

FIG. 7 is an illustration of a structure of a semiconductor device according to a first embodiment of the present invention. Elements in FIG. 7 that are described above are referenced by the same reference marks, and will not be described in detail.

In the present embodiment, as shown in FIG. 7, after the formation of the interconnection layer 56, a first insulating film 57A is so formed on the interconnection layer 56 in place of the etching stopper film 57 as to cover the Cu interconnection patterns 56A to 56D directly. The first insulating film 57A is formed of an SiN film, an SiC film or a BN film. The first insulating film 57A is formed by a low-temperature deposition process, such as a plasma CVD method, at a temperature that does not cause stress-migrations in the Cu interconnection patterns 56A to 56D. Further, a second insulating film 57B is formed on the first insulating film 57A at a deposition temperature normally used in forming an etching stopper film. The second insulating film 57B is formed of an SiN film, an SiC film or a BN film.

For example, in a case where the first insulating film 57A and the second insulating film 57B are formed of SiN films, the first insulating film 57A is formed approximately 30 nm thick by supplying an RF power of 300 to 500 W at 13.56 MHz and further supplying a bias power of 300 to 500 W at 400 kHz, at a substrate temperature of 300 to 350° C., in a mixed plasma of an SiH$_4$ gas, an NH$_3$ gas and an N$_2$ gas, under a pressure of 1 to 10 Torr (133 Pa to 1.33 kPa). The second insulating film 57B is formed by supplying an RF power of 300 to 500 W at 13.56 MHz and further supplying a bias power of 300 to 500 W at 400 kHz, at a substrate temperature set to 350 to 400° C., in a mixed plasma of an SiH$_4$ gas, an NH$_3$ gas and an N$_2$ gas, under a pressure of 1 to 10 Torr (133 Pa to 1.33 kPa). In this course, the bias power supplied in forming the second insulating film 57B is set larger than the bias power supplied in forming the first insulating film 57A.

The SiN film 57A thus formed has a film density lower than 2.8 g/cm$^3$, for example, 2.6 g/cm$^3$, whereas the SiN film 57B has a film density not lower than 2.8 g/cm$^3$.

As another example, in a case where the first insulating film 57A and the second insulating film 57B are formed of SiC films, the first insulating film 57A is formed by supplying an RF power of 300 to 500 W at 13.56 MHz and further supplying a bias power of 300 to 500 W at 400 kHz, at a substrate temperature of 300 to 350° C., in a mixed plasma of a methylsilane gas, such as a 4-methylsilane gas, a 3-methylsilane gas or a 2-methylsilane gas, an NH₃ gas, an He gas and an N₂ gas, under a pressure of 1 to 10 Torr (133 Pa to 1.33 kPa). The second insulating film 57B is formed by supplying an RF power of 300 to 500 W at 13.56 MHz and further supplying a bias power of 300 to 500 W at 400 kHz, at a substrate temperature set to 350 to 400° C., in a mixed plasma of the above-mentioned methylsilane gas, an NH₃ gas, an He gas and an N₂ gas, under a pressure of 1 to 10 Torr (133 Pa to 1.33 kPa). In this course, the bias power supplied in forming the second insulating film 57B is set larger than the bias power supplied in forming the first insulating film 57A.

The SiC film 57A thus formed has a film density of approximately 1.8 g/cm³, whereas the SiC film 57B has a film density of approximately 1.9 g/cm³.

According to the present invention, since the SiC insulating film 57A is formed at a low temperature not higher than 350° C., stress-migrations do not occur in the Cu interconnection patterns 56A to 56D. Additionally, although the insulating film 57A formed at such a low temperature has a small film density, and thus does not function as an effective etching stopper film, the insulating film 57A functions as an effective diffusion prevention film. Further, forming the insulating film 57B as an etching stopper film on the diffusion prevention film 57A enables the manufacture of a highly reliable semiconductor device with a high yield rate.

In the present embodiment, in addition to a conventional film, such as a CVD-SiO₂ film, a PSG film or a BPSG film, the following films can be used as the above-mentioned insulating interlayer film 54: an F-(fluorine)-doped SiO₂ film (an FSG film), an allyl-ether-based organic insulating film, an aromatic hydrocarbon polymer insulating film, a fluorocarbon-based insulating film, a siloxane-hydride-(HSQ)-based insulating film, a methyl-silsesquioxane-hydride-based insulating film, a porous-quioxane-based insulating film, a porous-allyl-ether-based insulating film, etc.

Besides, in the structure shown in FIG. 7, low-resistive silicide films 53a and 53b are formed on the gate electrodes 53A and 53B, respectively, by salicide processes. Additionally, similar low-resistive silicide films are formed on the surfaces of the diffusion areas 51a to 51d.

[Embodiment 2]

FIG. 8A to FIG. 12B are illustrations showing steps of manufacturing a semiconductor device according to a second embodiment of the present invention. Elements in FIG. 8A to FIG. 12B that are described above are referenced by the same reference marks, and will not be described in detail.

Figure 8A:
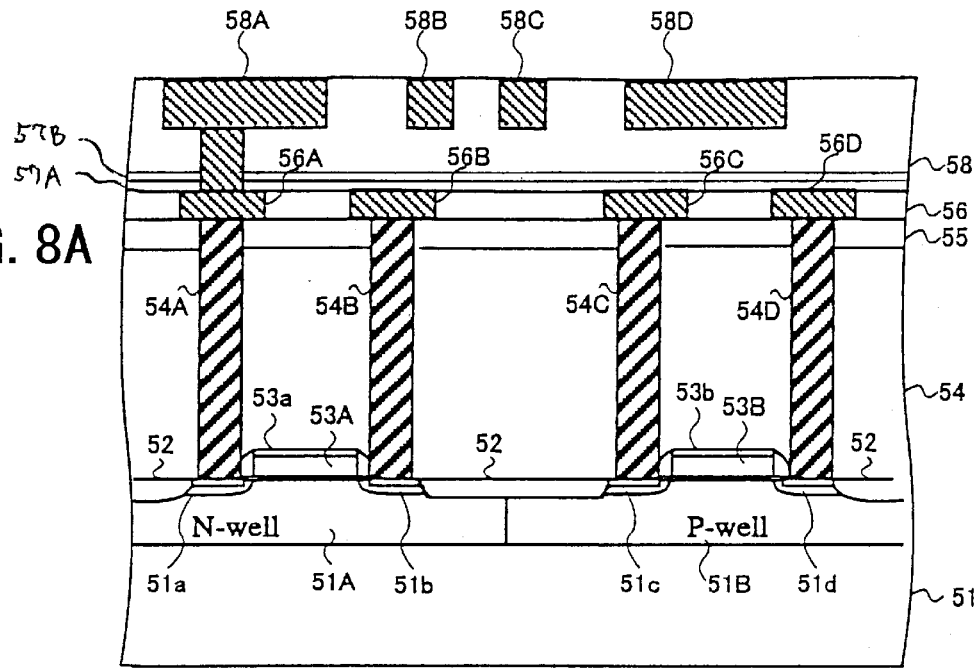
FIG. 8A and FIG. 8B are first and second illustrations showing steps of manufacturing a semiconductor device according to a second embodiment of the present invention.

As shown in FIG. 8A, the insulating interlayer film 58 is formed on the structure shown in FIG. 7. Cu interconnection patterns 58A to 58D are formed in the insulating interlayer film 58. The Cu interconnection pattern 58A is in contact with the Cu interconnection pattern 56A in the interconnection layer 56 via a via hole formed in the insulating interlayer film 58. The diffusion prevention film 57A and the etching stopper film 57B are formed between the interconnection layer 56 and the insulating interlayer film 58 also in a structure shown in FIG. 8A.

Figure 8B:
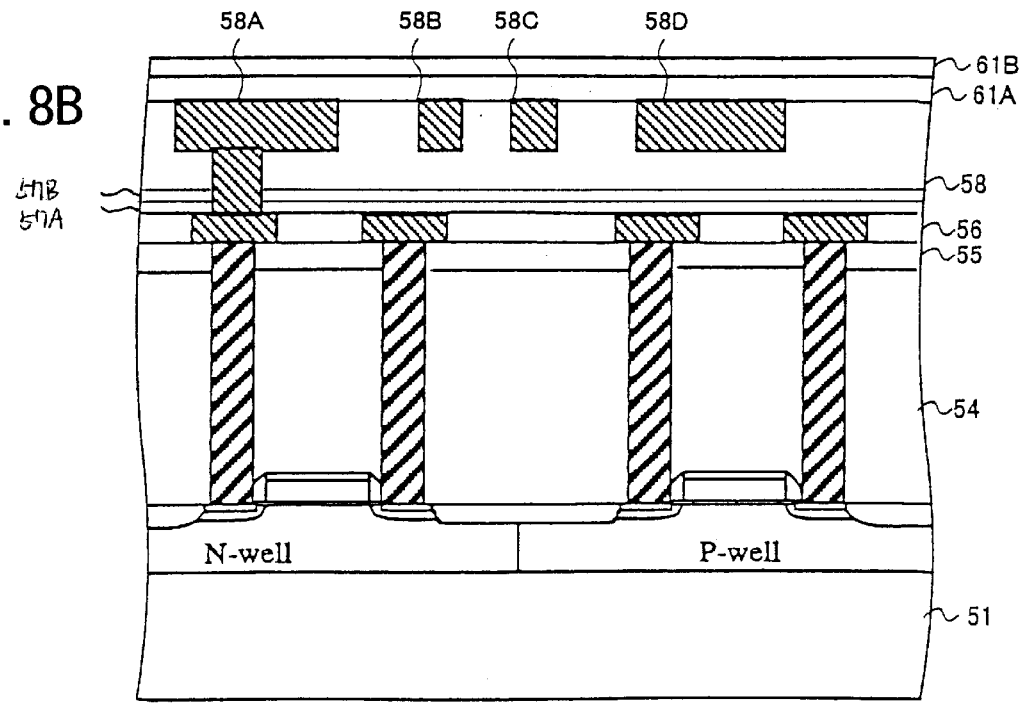

Next, in a step shown in FIG. 8B, a first (lower) insulating film 61A of SiN and a second (upper) insulating film 61B of SiN are formed on the structure shown in FIG. 8A as a diffusion prevention film and an etching stopper film, respectively.

The first insulating film 61A is formed approximately 30 nm thick by supplying an RF power of 300 to 500 W at 13.56 MHz and further supplying a bias power of 300 to 500 W at 400 kHz, at a substrate temperature of 300 to 350° C., in a mixed plasma of an SiH₄ gas, an NH₃ gas and an N₂ gas, under a pressure of 1 to 10 Torr (133 Pa to 1.33 kPa), in the same manner as the above-described SiN film 57A. The second insulating film 61B is formed by supplying an RF power of 300 to 500 W at 13.56 MHz and further supplying a bias power of 300 to 500 W at 400 kHz, at a substrate temperature set to 350 to 400° C., in a mixed plasma of an SiH₄ gas, an NH₃ gas and an N₂ gas, under a pressure of 1 to 10 Torr (133 Pa to 1.33 kPa), in the same manner as the above-described SiN film 57B. In this course, the bias power supplied in forming the second insulating film 61B is set larger than the bias power supplied in forming the first insulating film 61A. Also in this course, after the formation of the first insulating film 61A, the substrate temperature is preferably decreased to a room temperature, and then increased to the above-mentioned temperature of 350 to 400° C.

The (lower) SiN film 61A thus formed has a film density lower than 2.8 g/cm³, for example, 2.6 g/cm³, whereas the (upper) SiN film 61B has a film density equal to or higher than 2.8 g/cm³. According to the present invention, since the SiN film 61A is formed at a low temperature not higher than 350° C., stress-migrations do not occur in the Cu interconnection patterns 58A to 58D formed in the insulating interlayer film 58.

In the present embodiment, the first and second insulating films 61A and 61B can be formed of SiC films, as in the above-described first embodiment.

Figure 9A:
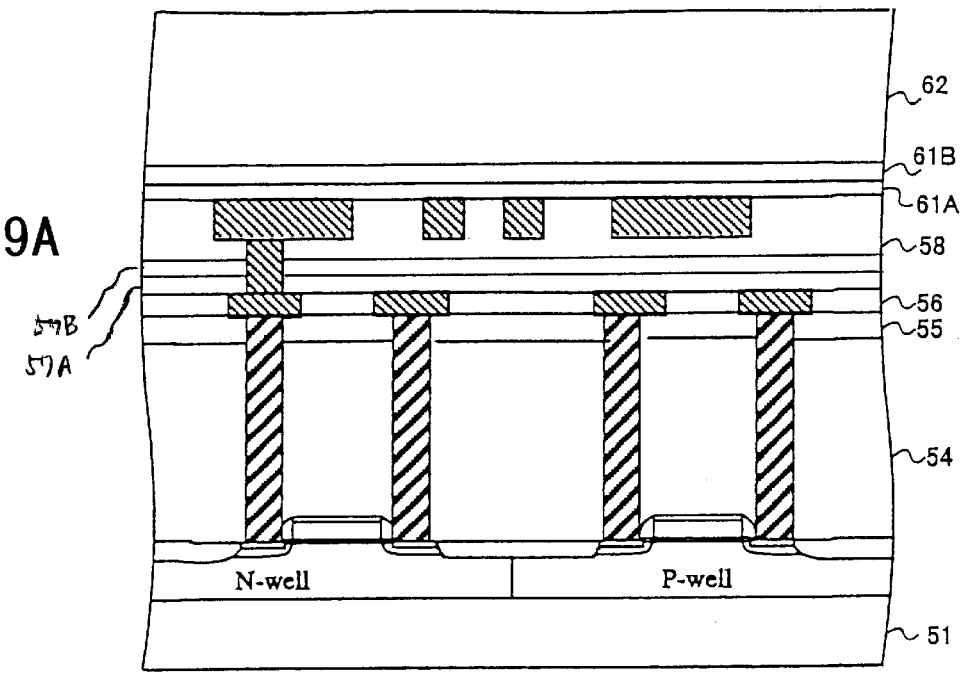
FIG. 9A and FIG. 9B are third and fourth illustrations showing the steps of manufacturing the semiconductor device according to the second embodiment of the present invention.
Figure 9B:
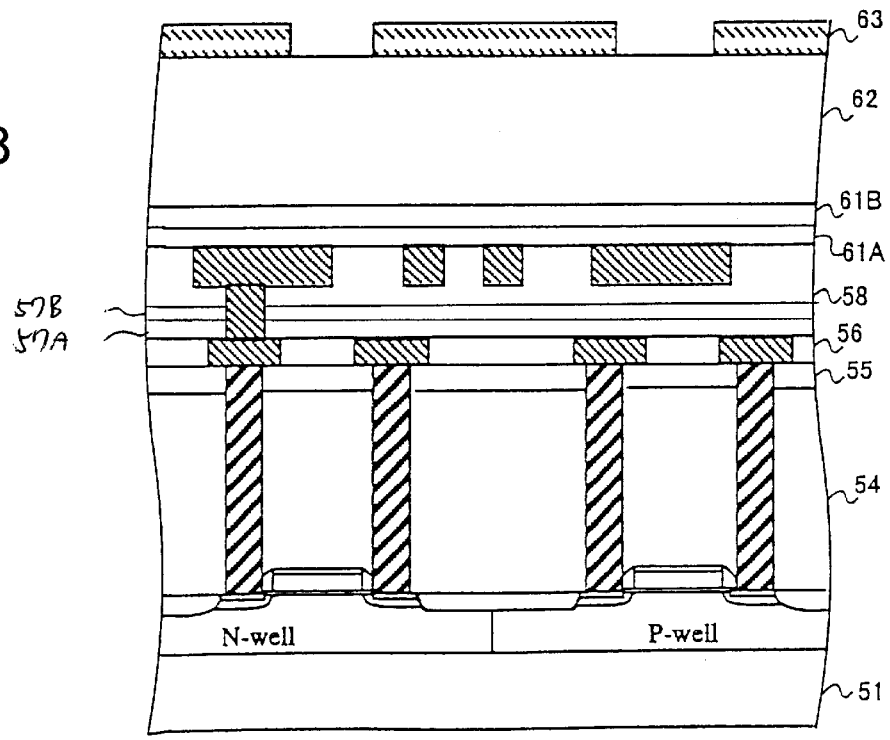

Subsequently, in a step shown in FIG. 9A, a next insulating interlayer film 62 is formed on the structure shown in FIG. 8B. Then, in a step shown in FIG. 9B, a resist pattern 63 is formed on the insulating interlayer film 62. The resist pattern 63 has openings formed at positions corresponding to via holes to be formed in the insulating interlayer film 62.

Figure 10A:
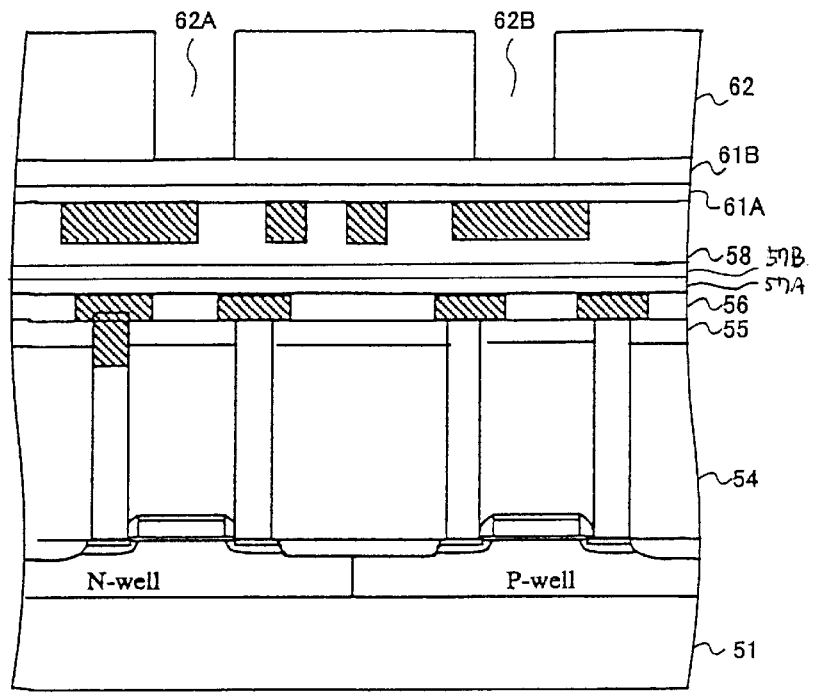
FIG. 10A and FIG. 10B are fifth and sixth illustrations showing the steps of manufacturing the semiconductor device according to the second embodiment of the present invention.

Next, in a step shown in FIG. 10A, the insulating interlayer film 62 is subjected to a dry etching using the resist pattern 63 as a mask so as to form desired via holes 62A and 62B in the insulating interlayer film 62, which exposes the etching stopper film 61B at the bottom of the via holes 62A and 62B. In this course, the etching stopper film 61B at the bottom of the via holes 62A and 62B exhibits a lower etching rate than the diffusion prevention film 61a would exhibit if the diffusion prevention film 61a is subjected to the above-mentioned dry etching.

Figure 10B:
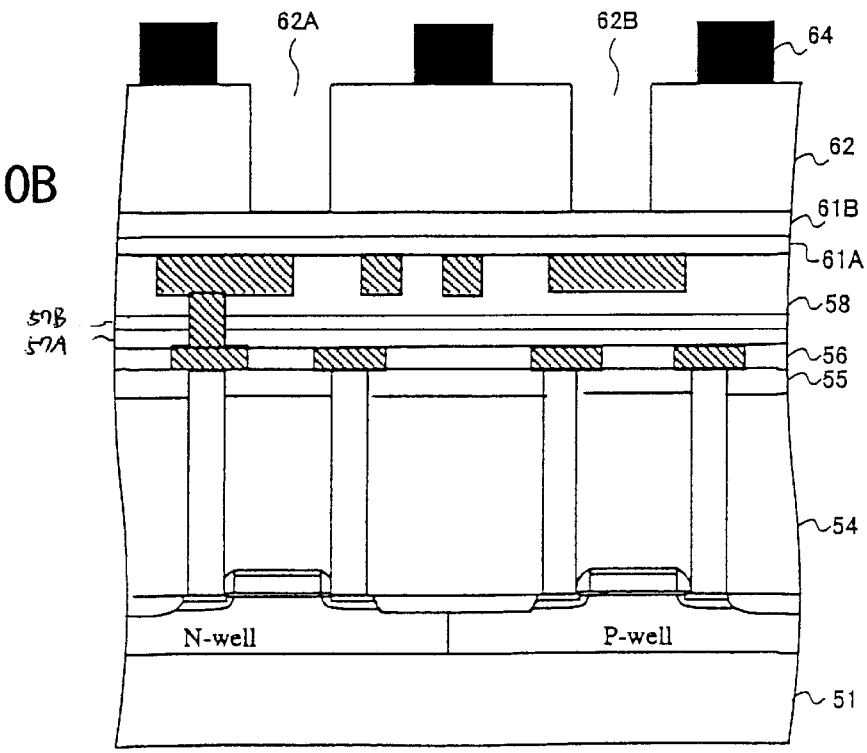

Subsequently, in a step shown in FIG. 10B, a resist pattern 64 is formed on the insulating interlayer film 62. The resist pattern 64 has openings formed at positions corresponding to interconnection patterns to be formed in the insulating interlayer film 62. Next, in a step shown in FIG. 11A, the insulating interlayer film 62 is subjected to a dry etching using the resist pattern 64 as a mask so as to form interconnection grooves 62C and 62D in the insulating interlayer film 62. The interconnection grooves 62C and 62D include the via holes 62A and 62B, respectively.

Figure 11A:
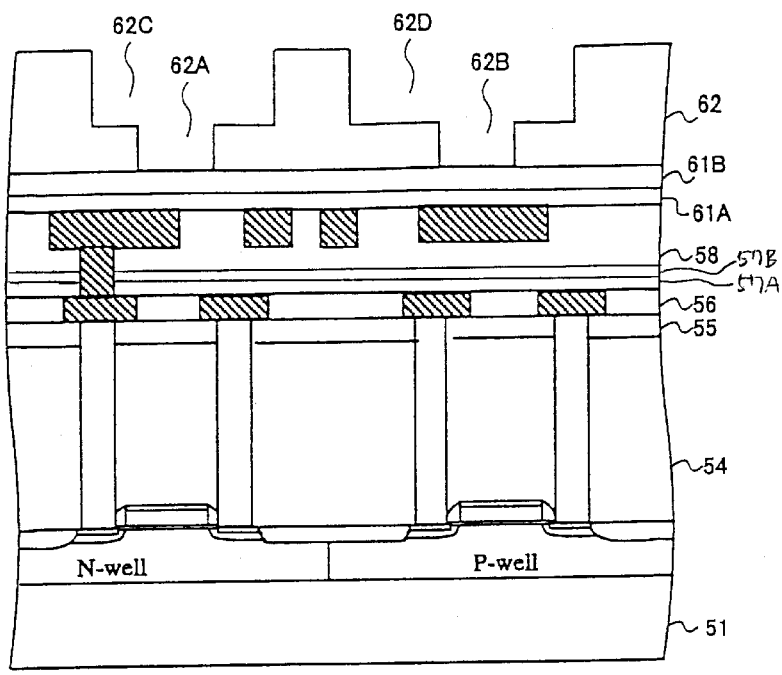
FIG. 11A and FIG. 11B are seventh and eighth illustrations showing the steps of manufacturing the semiconductor device according to the second embodiment of the present invention.
Figure 11B:
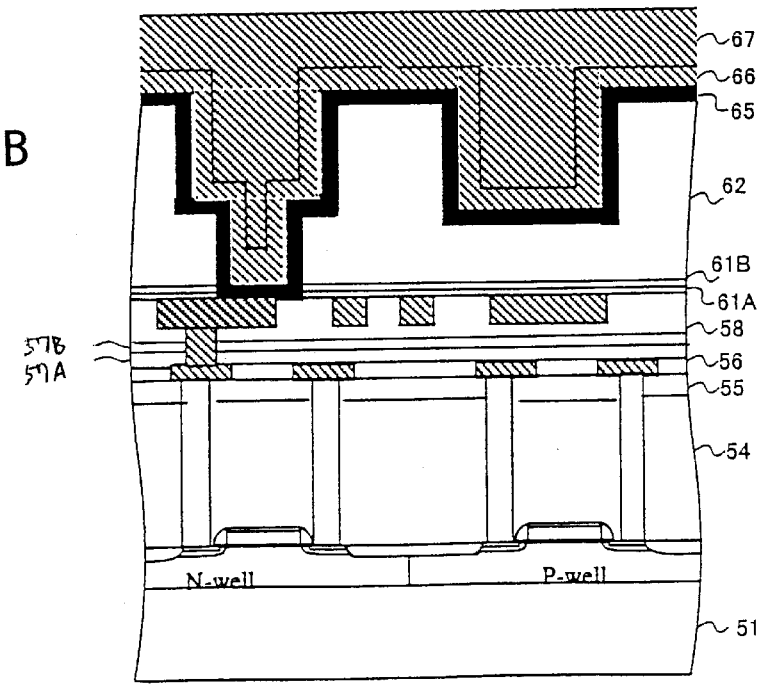

Subsequently, in a step shown in FIG. 11B, a TaN film 65 and a Cu seed film 66 are successively formed 250 nm and 1000 nm thick, respectively, by sputtering on the surface of the interconnection grooves 62C and 62D including the via holes 62A and 62B. Further, an electroplating process is performed by using the Cu seed film 66 as an electrode so as to fill the via holes 62A and 62B and the interconnection grooves 62C and 62D with a Cu layer 67 approximately 1500 nm thick.

Figure 12A:
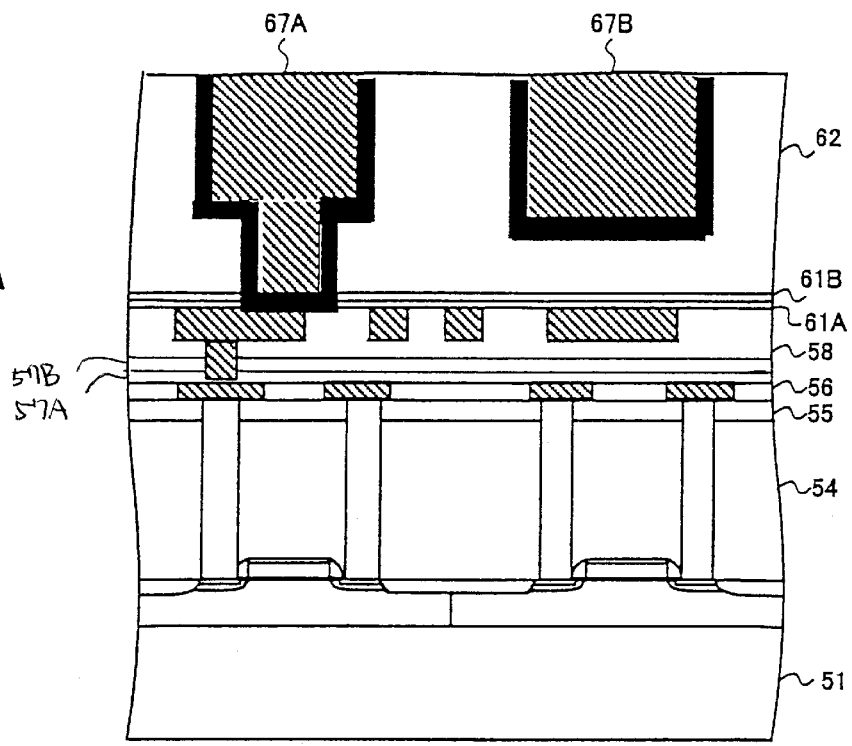
FIG. 12A and FIG. 12B are ninth and tenth illustrations showing the steps of manufacturing the semiconductor device according to the second embodiment of the present invention.

Next, in a step shown in FIG. 12A, the TaN film 65, the Cu seed film 66 and the Cu layer 67 are removed from the surface of the insulating interlayer film 62 by a CMP method so as to achieve desired Cu interconnection patterns 67A and 67B.

Figure 12B:
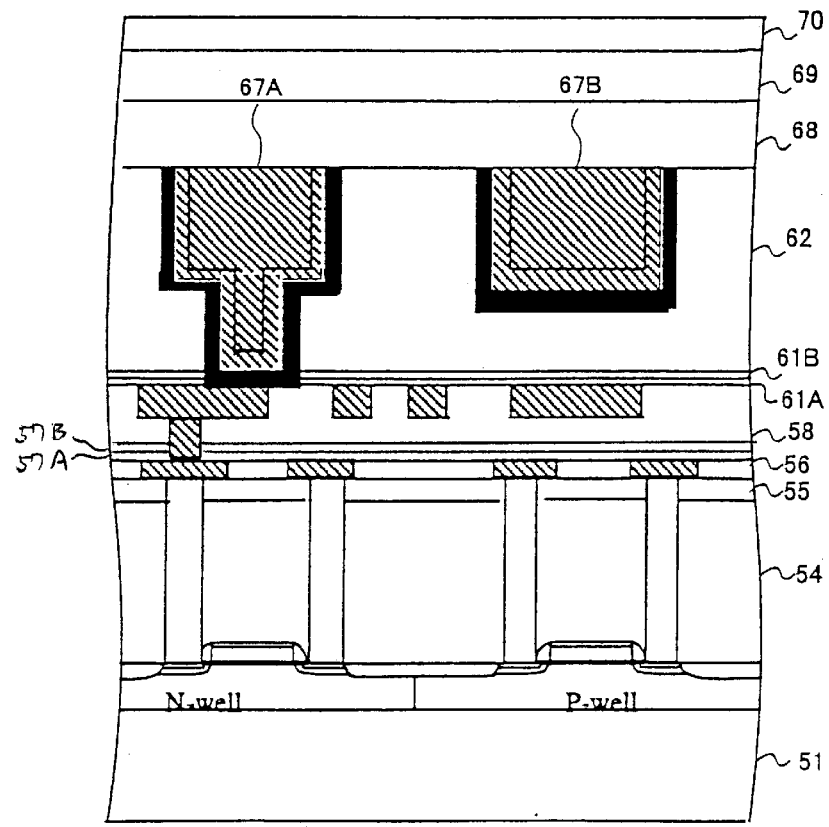

Finally, in a step shown in FIG. 12B, a plasma SiN film 68, a plasma SiON film 69 and a plasma SiN film 70 are formed 100 nm, 700 nm, 500 nm thick, respectively, on the structure shown in FIG. 12A.

Figure 1A:
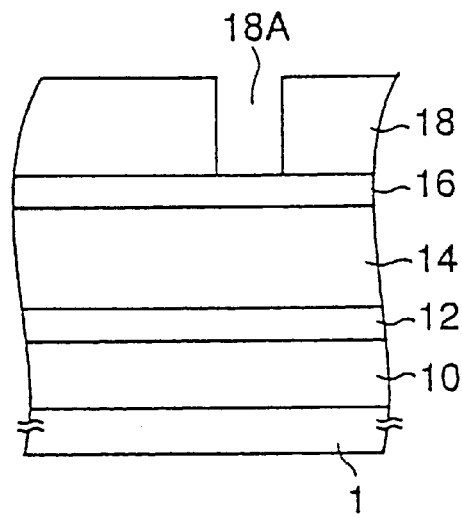
FIG. 1A to FIG. 1C are first to third illustrations showing a first example of steps of forming a multilayer interconnection structure according to a conventional dual damascene method.
Figure 1B:
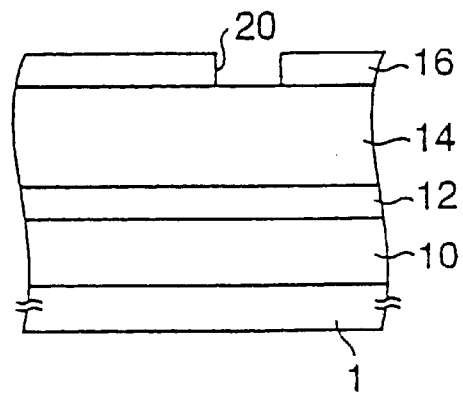
Figure 1C:
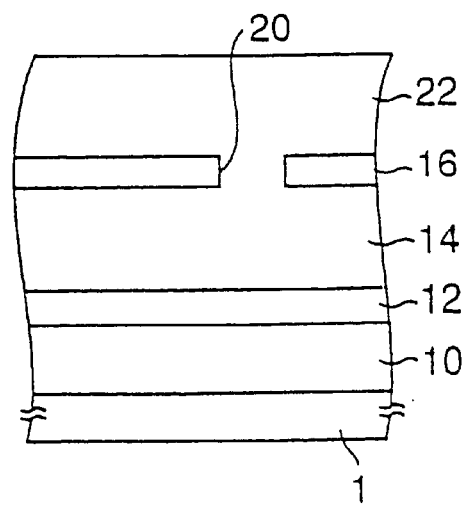
Figure 2A:
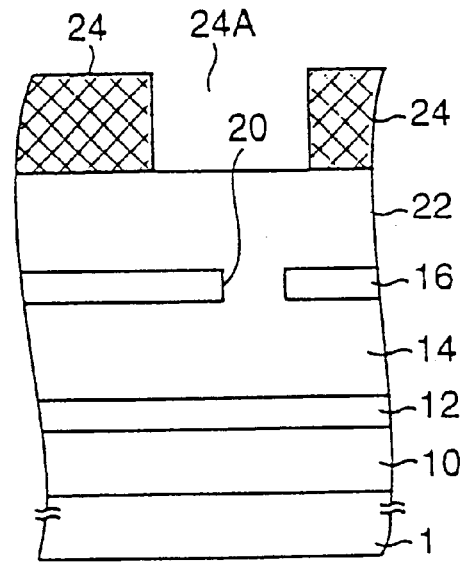
FIG. 2A to FIG. 2C are fourth to sixth illustrations showing the first example of the steps of forming the multilayer interconnection structure according to the conventional dual damascene method.
Figure 2B:
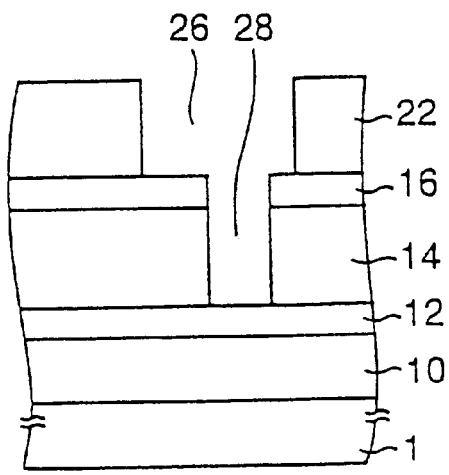
Figure 2C:
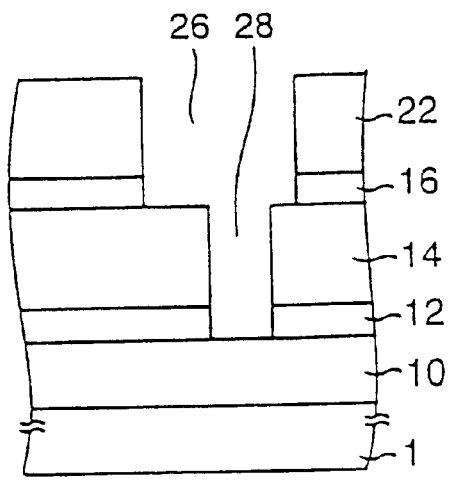
Figure 3A:
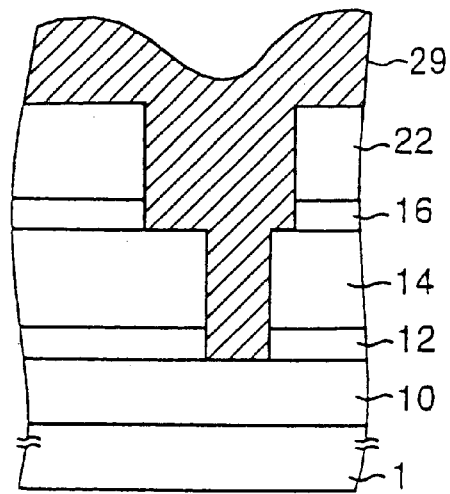
FIG. 3A and FIG. 3B are seventh and eighth illustrations showing the first example of the steps of forming the multilayer interconnection structure according to the conventional dual damascene method.
Figure 3B:
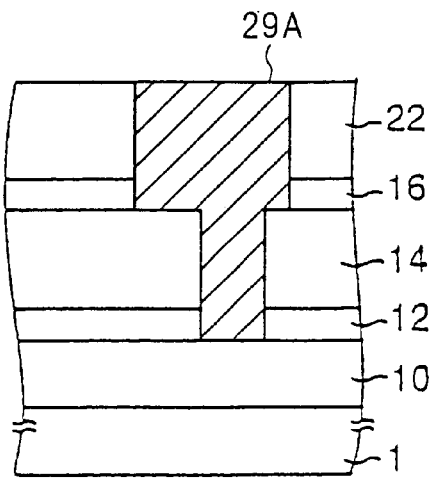
Figure 4A:
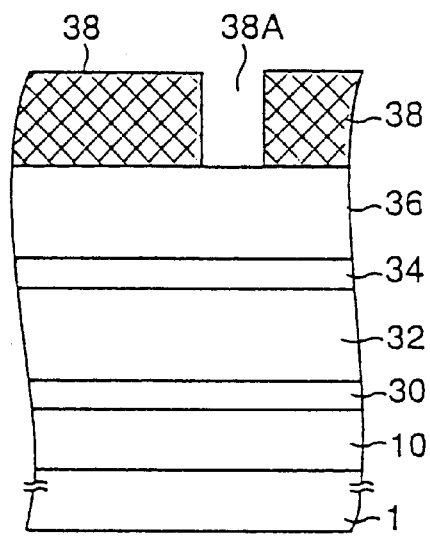
FIG. 4A to FIG. 4C are first to third illustrations showing a second example of steps of forming a multilayer interconnection structure according to a conventional dual damascene method.
Figure 4B:
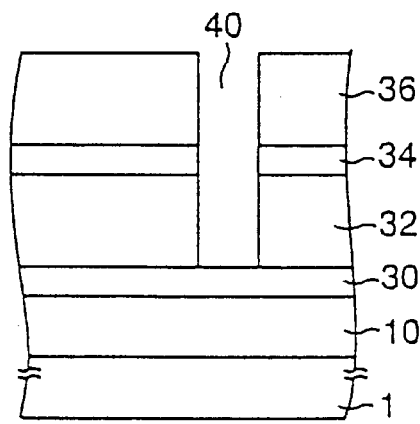
Figure 4C:
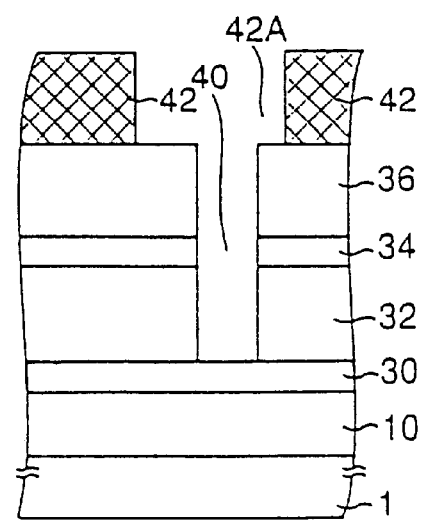
Figure 5A:
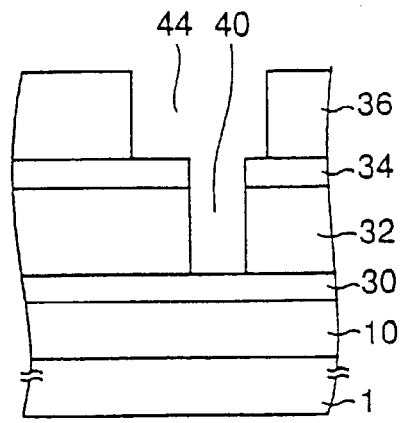
FIG. 5A to FIG. 5C are fourth to sixth illustrations showing the second example of the steps of forming the multilayer interconnection structure according to the conventional dual damascene method.
Figure 5B:
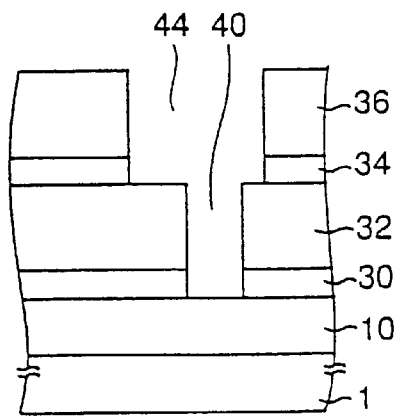
Figure 5C:
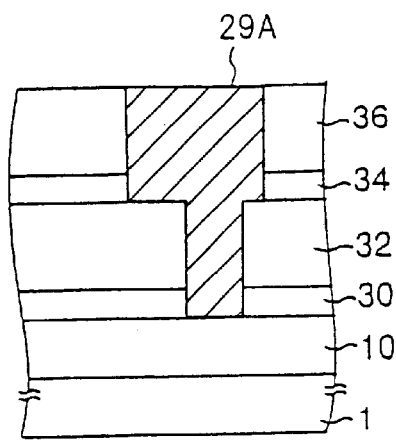
Figure 6:
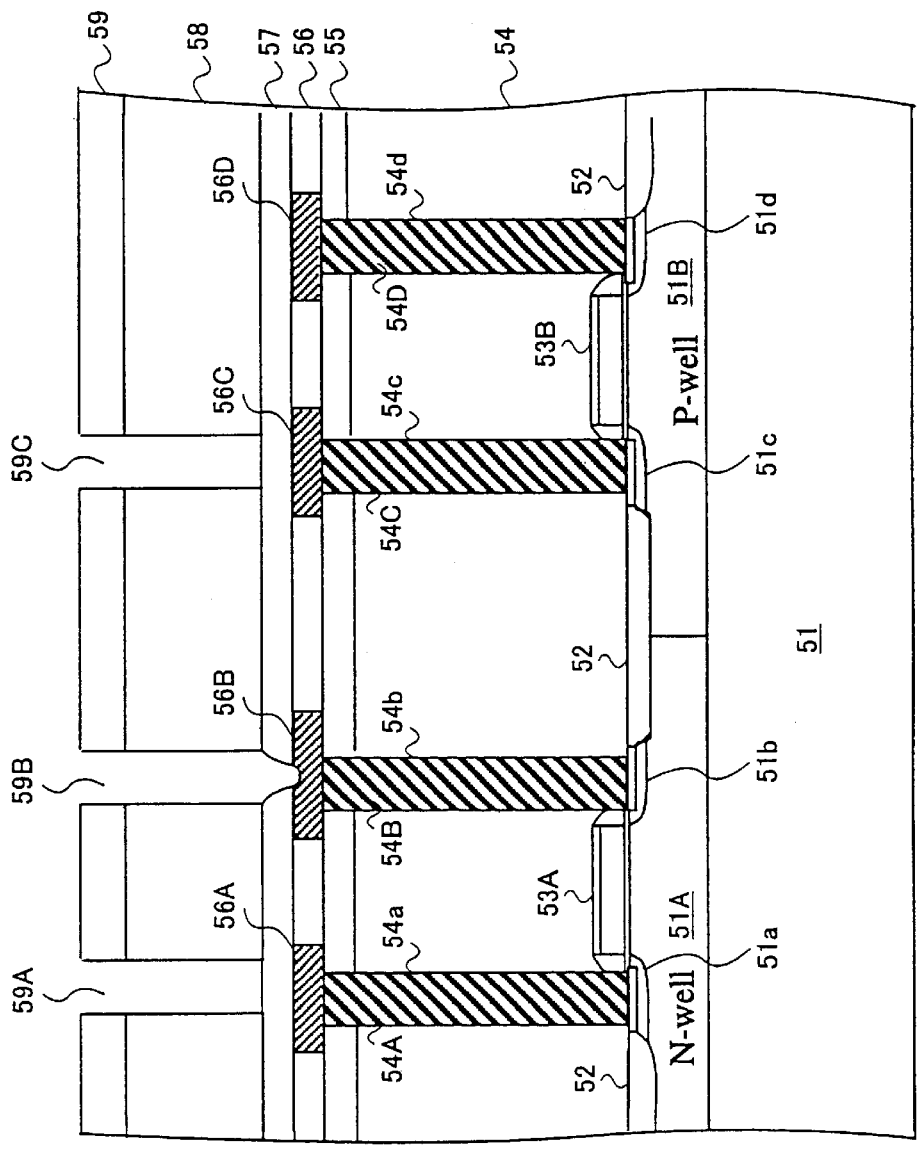
FIG. 6 explains problems in a multilayer interconnection structure of a semiconductor device according to conventional technologies.

TABLE 1 below shows survey results including an initial yield rate of the semiconductor device having the structure shown in FIG. 12B and a percent defective thereof when the semiconductor device is left at 250° C. for 168 hours. In the semiconductor device, the Cu interconnection pattern 67A is formed 5 μm wide and 20 μm long, and includes a via contact portion 0.22 μm in diameter. In TABLE 1, Experiment 4 (Exp. 4) shows the result of the present embodiment using the diffusion prevention film (the lower SiN film) 61A and the etching stopper film (the upper SiN film) 61B formed of SiN films. Experiment 1 (Exp. 1) shows a comparative example according to a conventional technology represented by the semiconductor device shown in FIG. 6 using a single layer of the SiN film formed by a plasma CVD process at 400° C. Experiment 2 (Exp. 2) shows a comparative example using a single layer of an SiN film formed by a plasma CVD process at 350° C. Experiment 3 (Exp. 3) shows a comparative example using the diffusion prevention film (the lower SiN film) 61A formed by a plasma CVD method at 400° C. and the etching stopper film (the upper SiN film) 61B formed by a plasma CVD method at 350° C.

TABLE 1

| | | Initial yield rate | Percent defective |
|---|---|---|---|
| Exp. 1 | Single-layer SiN film formed at 400° C. according to a conventional technology (film density: 2.8 g/cm$^3$) | 99% | 40% |
| Exp. 2 | Single-layer SiN film formed at 350° C. (film density: 2.6 g/cm$^3$) | 80% | 0% |
| Exp. 3 | Lower SiN film formed at 400° C. (film density: 2.8 g/cm$^3$) and upper SiN film formed at 350° C. (film density: 2.6 g/cm$^3$) | 90% | 30% |
| Exp. 4 | Lower SiN film formed at 350° C. (film density: 2.6 g/cm$^3$) and upper SiN film formed at 400° C. (film density: 2.8 g/cm$^3$) according to the present invention | 99% | 0% |

As shown in Experiment 1 in TABLE 1, when a single-layer SiN film, instead of the diffusion prevention film 61A and the etching stopper film 61B, is formed by a plasma CVD process at 400° C., this SiN film has such a large film density of 2.8 g/cm$^3$ as to function as an effective etching stopper film increasing the initial yield rate. However, since the SiN film is formed at a high temperature, when the SiN film is left at 250° C. for 168 hours, defects due to stress-migrations occur as much as 40%.

On the other hand, as shown in Experiment 2, when an SiN film having a film density of 2.6 g/cm$^3$ formed by a plasma CVD process at 350° C. is used as a single-layer SiN film instead of the diffusion prevention film 61A and the etching stopper film 61B, this SiN film does not function as an effective etching stopper film in etching a contact hole, but is etched due to the low film density thereof, causing an oxidization in Cu interconnection patterns under the SiN film.

Therefore, in Experiment 2, although defects due to stress-migrations do not occur, the initial yield rate is only approximately 80%.

Further as shown in Experiment 3, when the diffusion prevention film (the lower SiN film) 61A is formed as an SiN film having a film density of 2.8 g/cm$^3$ by a plasma CVD process performed at 400° C., and the etching stopper film (the upper SiN film) 61B is formed as an SiN film having a film density of 2.6 g/cm$^3$ by a plasma CVD process performed at 350° C., two problems occur as follows: one problem is a decrease in the initial yield rate due to an oxidization in Cu interconnection patterns in etching a contact hole; and the other problem is defects due to stress-migrations.

By contrast, as shown in Experiment 4, according to the present invention wherein the diffusion prevention film (the lower SiN film) 61A is formed as an SiN film having a film density of 2.6 g/cm$^3$ by a plasma CVD process performed at 350° C., and the etching stopper film (the upper SiN film) 61B is formed as an SiN film having a film density of 2.8 g/cm$^3$ by a plasma CVD process performed at 400° C., the improvement of the initial yield rate and the prevention of defects due to stress-migrations can be achieved at the same time.

TABLE 2 below shows similar survey results including a result regarding the present embodiment using the diffusion prevention film 61A and the etching stopper film 61B formed of SiC films.

TABLE 2

| | | Initial yield rate | Percent defective |
|---|---|---|---|
| Exp. 5 | Single-layer SiC:H film formed at 400° C. according to a conventional technology (film density: 2.0 g/cm$^3$) | 99% | 35% |
| Exp. 6 | Single-layer SiC:H film formed at 350° C. (film density: 1.8 g/cm$^3$) | 70% | 0% |
| Exp. 7 | Lower SiC:H film formed at 400° C. (film density: 2.0 g/cm$^3$) and upper SiC:H film formed at 350° C. (film density: 1.8 g/cm$^3$) | 85% | 35% |
| Exp. 8 | Lower SiC:H film formed at 350° C. (film density: 1.8 g/cm$^3$) and upper SiC:H film formed at 400° C. (film density: 2.0 g/cm$^3$) according to the present invention | 99% | 0% |

As shown in Experiment 5 in TABLE 2, when a single-layer SiC film, instead of the diffusion prevention film 61A and the etching stopper film 61B, is formed by a plasma CVD process at 400° C., this SiC film has such a large film density of 2.0 g/cm$^3$ as to function as an effective etching stopper film increasing the initial yield rate. However, since the SiC film is formed at a high temperature, when the SiC film is left at 250° C. for 168 hours, defects due to stress-migrations occur as much as 35%.

On the other hand, as shown in Experiment 6, when an SiC film having a film density of 1.8 g/cm³ formed by a plasma CVD process at 350° C. is used as a single-layer SiC film instead of the diffusion prevention film 61A and the etching stopper film 61B, this SiC film does not function as an effective etching stopper film in etching a contact hole, but is etched due to the low film density thereof, causing an oxidization in Cu interconnection patterns under the SiC film. Therefore, in Experiment 6, although defects due to stress-migrations do not occur, the initial yield rate is only approximately 70%.

Further as shown in Experiment 7, when the diffusion prevention film (the lower SiC film) 61A is formed as an SiC film having a film density of 2.0 g/cm³ by a plasma CVD process performed at 400° C., and the etching stopper film (the upper SiC film) 61B is formed as an SiC film having a film density of 1.8 g/cm³ by a plasma CVD process performed at 350° C., two problems occur as follows: one problem is a decrease in the initial yield rate due to an oxidization in Cu interconnection patterns in etching a contact hole; and the other problem is defects due to stress-migrations.

By contrast, as shown in Experiment 8, according to the present invention wherein the diffusion prevention film (the lower SiC film) 61A is formed as an SiC film having a film density of 1.8 g/cm³ by a plasma CVD process performed at 350° C., and the etching stopper film (the upper SiC film) 61B is formed as an SiC film having a film density of 2.0 g/cm³ by a plasma CVD process performed at 400° C., the improvement of the initial yield rate and the prevention of defects due to stress-migrations can be achieved at the same time.

As described above, adopting the present invention can improve the initial yield rate, and also can restrain the percent defective due to stress-migrations in the semiconductor device to 0%.

The present invention does not employ a method as disclosed in Japanese Laid-Open Patent Application No. 2000-183059 mentioned above, in which, for the purpose of increasing an adhesion between a Cu layer and an SiN film, an Si-rich SiN film is used as an SiN film on a Cu interconnection pattern, and an N-rich SiN film is formed on the Si-rich SiN film. In contrast, the present invention employs a method in which a low-temperature SiN film is formed on the Cu interconnection pattern under conditions that do not form a silicide, such as $CuSi_2$, on the Cu interconnection pattern, and another SiN film is formed thereon at a higher temperature so that the upper SiN film has a higher film density. Therefore, the present invention can avoid the above-mentioned conventional problem that Cu in the Cu interconnection pattern and $SiH_4$ in a vapor-phase substance react with each other in forming the SiN film so that a high-resistive silicide, such as $CuSi_2$, is formed on the surface of the Cu interconnection pattern.

Besides, in the present invention, not only pure Cu, but also a Cu alloy containing minute amounts of metals other than Cu can be used as the Cu interconnection patterns. The present invention includes the use of such a Cu alloy.

Further, BN films can be used as the SiN films and the SiC films described above.

The present invention is not limited to the specifically disclosed embodiments, and variations and modifications may be made without departing from the scope of the present invention.

The present application is based on Japanese priority application No. 2001-203723 filed on Jul. 4, 2001, the entire contents of which are hereby incorporated by reference.

What is claimed is:

1. A method of manufacturing a semiconductor device, the method comprising the steps of:
   forming an insulating interlayer film on a substrate;
   forming a Cu interconnection pattern in said insulating interlayer film;
   forming a first insulating film on said insulating interlayer film at a first temperature lower than 400° C. in a nonoxide situation so that said first insulating film covers said Cu interconnection pattern; and
   forming a second insulating film of a same material as said first insulating film on said first insulating film at a second temperature higher than said first temperature.

2. The method as claimed in claim 1, further comprising the temperature-decreasing step of decrease a substrate temperature from said first temperature to a room temperature, and the temperature-increasing step of increase the substrate temperature from said room temperature to said second temperature, after said step of forming said first insulating film and before said step of forming said second insulating film.

3. The method as claimed in claim 2, wherein said step of forming said first insulating film, said temperature-decreasing step, said temperature-increasing step and said step of forming said second insulating film are performed in succession in a same depositing device.

4. The method as claimed in claim 1, wherein said first insulating film and said second insulating film are SiN films, said step of forming said first insulating film is performed by setting said first temperature within a range from 300 to 350° C., and said step of forming said second insulating film is performed by setting said second temperature within a range from 350 to ,400° C.

5. The method as claimed in claim 4, wherein said step of forming said first insulating film and said step of forming said second insulating film are performed by a plasma CVD method in a mixed gas plasma of a silane gas, an ammonia gas and a nitrogen gas.

6. The method as claimed in claim 1, wherein said first insulating film and said second insulating film are SiC films, said step of forming said first insulating film is performed by setting said first temperature within a range from 300 to 350° C., and said step of forming said second insulating film is performed by setting said second temperature within a range from 350 to 400° C.

7. The method as claimed in claim 6, wherein said step of forming said first insulating film and said step of forming said second insulating film are performed by a plasma CVD method in a mixed gas plasma of a methylsilane gas, an ammonia gas and a nitrogen gas.

8. A method of manufacturing a semiconductor device, the method comprising the steps of:
   forming an insulating interlayer film on a substrate;
   forming a Cu interconnection pattern in said insulating interlayer film;
   forming a first insulating film on said insulating interlayer film at a first temperature lower than 400° C. in a nonoxide situation so that said first insulating film covers said Cu interconnection pattern;
   forming a second insulating film on said first insulating film at a second temperature higher than said first temperature; and
   further comprising the temperature-decreasing step of decrease a substrate temperature from said first temperature to a room temperature, and the temperature-increasing step of increase the substrate temperature from said room temperature to said second temperature, after said step of forming said first insulating film and before said step of forming said second insulating film.

9. The method as claimed in claim 8, wherein said step of forming said first insulating film, said temperature-decreasing step, said temperature-increasing step and said step of forming said second insulating film are performed in succession in a same depositing device.

10. A method of manufacturing a semiconductor device, the method comprising the steps of:

forming an insulating interlayer film on a substrate;

forming a Cu interconnection pattern in said insulating interlayer film;

forming a first insulating film on said insulating interlayer film at a first temperature lower than 400° C. in a nonoxide situation so that said first insulating film covers said Cu interconnection pattern; and forming a second insulating film on said first insulating film at a second temperature higher than said first temperature;

wherein said first insulating film and said second insulating film are SiN films, said step of forming said first insulating film is performed by setting said first temperature within a range from 300 to 350° C., and said step of forming said second insulating film is performed by setting said second temperature within a range from 350 to 400° C.

11. The method as claimed in claim 10, wherein said step of forming said first insulating film and said step of forming said second insulating film are performed by a plasma CVD method in a mixed gas plasma of a silane gas, an ammonia gas and a nitrogen gas.

12. A method of manufacturing a semiconductor device, the method comprising the steps of:

forming an insulating interlayer film on a substrate;

forming a Cu interconnection pattern in said insulating interlayer film;

forming a first insulating film on said insulating interlayer film at a first temperature lower than 400° C. in a nonoxide situation so that said first insulating film covers said Cu interconnection pattern; and forming a second insulating film on said first insulating film at a second temperature higher than said first temperature;

wherein said first insulating film and said second insulating film are SiC films, said step of forming said first insulating film is performed by setting said first temperature within a range from 300 to 350° C., and said step of forming said second insulating film is performed by setting said second temperature within a range from 350 to 400° C.

13. The method as claimed in claim 12, wherein said step of forming said first insulating film and said step of forming said second insulating film are performed by a plasma CVD method in a mixed gas plasma of a methylsilane gas, an ammonia gas and a nitrogen gas.

* * * * *